(12) United States Patent
Park et al.

(10) Patent No.: US 10,852,866 B2
(45) Date of Patent: Dec. 1, 2020

(54) DISPLAY DEVICE

(71) Applicant: SAMSUNG DISPLAY CO., LTD., Yongin-si (KR)

(72) Inventors: Jinwoo Park, Asan-si (KR); Hyunduck Cho, Anyang-si (KR); Wonkyu Kwak, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 15/724,885

(22) Filed: Oct. 4, 2017

(65) Prior Publication Data

US 2018/0129328 A1 May 10, 2018

(30) Foreign Application Priority Data

Nov. 4, 2016 (KR) .................. 10-2016-0146864

(51) Int. Cl.
*G06F 3/041* (2006.01)
*G09G 3/20* (2006.01)
(Continued)

(52) U.S. Cl.
CPC .......... *G06F 3/0412* (2013.01); *G01J 3/0208* (2013.01); *G01S 7/4813* (2013.01); *G01S 7/4814* (2013.01); *G01S 7/4816* (2013.01); *G01S 17/04* (2020.01); *G01S 17/88* (2013.01); *G06F 1/3231* (2013.01); *G06F 3/017* (2013.01);
(Continued)

(58) Field of Classification Search
CPC .................. G98G 2360/14; G09G 3/20; G06F 2203/04103; G06F 3/14; G06F 3/0428; G06F 3/0421; G06F 3/0416; G06F 3/0412; G06F 1/3231; G01J 3/0208
See application file for complete search history.

(56) References Cited

U.S. PATENT DOCUMENTS 4,286,327 A * 8/1981 Rosenthal ............ G01N 21/255
 250/338.4
5,270,527 A * 12/1993 Salzmann ............ G02B 21/241
 250/201.3
(Continued)

FOREIGN PATENT DOCUMENTS

KR 10-2014-0144635 12/2014
KR 10-1598634 2/2016

OTHER PUBLICATIONS

Korean Office Action dated Jan. 21, 2019 for Application Serial No. 10-2016-0149864.
(Continued)

*Primary Examiner* — Mihir K Rayan
(74) *Attorney, Agent, or Firm* — F. Chau & Associates, LLC

(57) ABSTRACT

A display device includes a display panel and an infrared sensing module. The display panel includes an active region in which a pixel that emits light based on a data signal is disposed. The infrared sensing module transmits a first infrared light that passes through the active region and receives a second infrared light that passes through the active region to recognize an object. The wavelength of the first infrared light may have a wavelength greater than a predetermined value so that a luminance of light emitted by the pixel is not affected by operation of the infrared sensing module.

19 Claims, 9 Drawing Sheets

(51) Int. Cl.
*G06F 3/042* (2006.01)
*G06F 3/14* (2006.01)
*G06F 1/3231* (2019.01)
*H04M 1/02* (2006.01)
*G01S 17/88* (2006.01)
*G01S 7/481* (2006.01)
*G06F 3/01* (2006.01)
*G01S 17/04* (2020.01)
*G01J 3/02* (2006.01)

(52) U.S. Cl.
CPC .......... *G06F 3/0416* (2013.01); *G06F 3/0421* (2013.01); *G06F 3/0428* (2013.01); *G06F 3/14* (2013.01); *G09G 3/20* (2013.01); *H04M 1/0266* (2013.01); *G06F 2203/04103* (2013.01); *G09G 2360/14* (2013.01); *H04M 2250/12* (2013.01)

(56) References Cited

U.S. PATENT DOCUMENTS

| | | | |
|---|---|---|---|
| 7,495,638 | B2 | 2/2009 | Lamvik et al. |
| 8,520,114 | B2 | 8/2013 | Cok et al. |
| 8,698,859 | B2* | 4/2014 | DeLuca ............... G09G 5/14 345/102 |
| 2003/0117423 | A1 | 6/2003 | Brown Elliott et al. |
| 2003/0193599 | A1* | 10/2003 | Campbell ............ H04N 13/225 348/333.01 |
| 2004/0080011 | A1* | 4/2004 | Starikov ............... H01L 31/108 257/481 |
| 2004/0263670 | A1* | 12/2004 | Yamasaki ........... H01L 27/3234 348/340 |
| 2006/0244693 | A1* | 11/2006 | Yamaguchi ............. G06F 3/042 345/76 |
| 2008/0122803 | A1* | 5/2008 | Izadi .................... G06F 3/0421 345/175 |
| 2008/0150848 | A1* | 6/2008 | Chung .................. G06F 3/0412 345/82 |
| 2009/0027652 | A1* | 1/2009 | Chang ..................... G01C 3/08 356/4.01 |
| 2009/0058824 | A1* | 3/2009 | Nissar .................. G06F 3/0412 345/173 |
| 2009/0146967 | A1* | 6/2009 | Ino .................... G02F 1/133526 345/173 |
| 2011/0037849 | A1* | 2/2011 | Niclass ................. G01S 7/4814 348/135 |
| 2011/0043487 | A1* | 2/2011 | Huang ................. G09G 3/3233 345/175 |
| 2011/0096021 | A1* | 4/2011 | Kim .................... G02F 1/13338 345/174 |
| 2014/0361175 | A1 | 12/2014 | Lim et al. |
| 2016/0217751 | A1* | 7/2016 | Lahti .................... G09G 3/3406 |
| 2018/0129328 | A1* | 5/2018 | Park .................... H01L 27/3234 |

OTHER PUBLICATIONS

Office Action for U.S. Appl. No. 15/285,732.
Notice of Allowance for U.S. Appl. No. 16/235,732 dated Nov. 15, 2019.
Notice of Allowance for U.S. Appl. No. 16/286,732 dated Apr. 6, 2020.

* cited by examiner

G1: NO IR APPLIED TO PIXEL
G2: IR OF 940nm APPLIED TO PIXEL

G5: CURRENT DIFFERENCE ΔIOFF BETWEEN FIRST
LEAKAGE CURRENT AND SECOND LEAKAGE CURRENT

DISPLAY DEVICE

CROSS-REFERENCE TO RELATED APPLICATION(S)

This application claims priority under 35 U.S.C. § 119 from Korean Patent Application No. 10-2016-0146864, filed on Nov. 4, 2016 in the Korean Intellectual Property Office (KIPO), the contents of which are incorporated by reference herein.

TECHNICAL FIELD

Embodiments of the inventive concept relate generally to a display device. More particularly, embodiments of the present inventive concept relate to a display device that includes an infrared sensor.

DISCUSSION OF THE RELATED

A display device displays an image using a pixel (or, a pixel circuit). Some display devices include an infrared sensor in a bezel (or, in an edge region) of its front surface (e.g., a surface on which the image is displayed). In such an arrangement, the display device can recognize an object within a predetermined distance from the display device via the infrared sensor. For example, the display device may transmit infrared light, may receive reflected light that is generated by the infrared light being reflected off of the object, may calculate a distance between the display device and the object based on intensity of the reflected light. Moreover, the display device may not display the image if the calculated distance is less than a specific distance.

Generally, as the bezel of the display device decreases, the eyes of a user may focus more on the image (or, a screen of the display device). Recently, many manufacturers have reduced the size of, or eliminated the bezel altogether from the front surface of the display device. When the display device does not include the bezel on the front surface of the display device, the display device can use the front surface of the display device more efficiently, for example, by displaying the image on an entire region of the front surface of the display device. In such a case, the infrared sensor may be relocated to another location of the display device.

SUMMARY

In an embodiment, the inventive concept may provide a display device that can display an image on an entire region of its front surface while including an infrared sensing function.

According to an embodiment of the inventive concept, a display device may include a display panel having a front surface and a rear surface, the display panel including an active region in which a pixel that emits light based on a data signal is disposed; and an infrared sensing module configured to transmit infrared light including at least a first infrared light that passes in a first direction away from the front surface of the display panel and through the active region, and the infrared sensing module is configured to receive a second infrared light that passes in a second direction toward the front surface of the display panel and through the active region by which the infrared sensing module recognizes an object external to the display device.

According to an embodiment of the inventive concept, the infrared sensing module is arranged on a rear surface of the display panel, and the infrared sensing module transmits the first infrared light in a first direction that is substantially perpendicular to the front surface of the display panel.

The infrared sensing module may be arranged to face the rear surface of the display panel to transmit the first infrared light through a portion of the active region of the display panel having a lower pixel density than a remainder of the active region.

The display device may further include a housing having a surface that faces the rear surface of the display panel, and wherein the infrared sensing module is arranged between the rear surface of the display panel and the housing.

According to an embodiment of the inventive concept, the second infrared light may include reflected light that is generated by the first infrared light being reflected by the object. In addition, the infrared sensing module may recognize the object based on a change of the second infrared light.

According to an embodiment of the inventive concept, the infrared sensing module may include at least one selected from a proximity sensor, a gesture sensor, and a fingerprint recognition sensor. According to an embodiment of the inventive concept, the first infrared light may have a first wavelength of more than about 1200 nm.

According to an embodiment of the inventive concept, a luminance of the pixel located in the active region is unchanged when the infrared sensing module transmits the first infrared light at the wavelength of greater than about 1200 nm.

According to an embodiment of the inventive concept, the first wavelength of the first infrared light may be 1300 nm.

According to an embodiment of the inventive concept, the pixel may include at least one transistor including silicon. In addition, the first infrared light may have a first wavelength that is out of a wavelength band of light that is absorbed by the silicon.

According to an embodiment of the inventive concept, the display device may further include a scan driver configured to generate a scan signal, and a data driver configured to generate the data signal based on image data that is provided from an external device. In addition, the pixel may include a light emitting element connected between a first power voltage and a second power voltage, a first transistor configured to control a driving current that flows through the light emitting element in response to a first node voltage of a first node, a second transistor configured to transfer the data signal to the first node in response to the scan signal, and a storage capacitor connected to the first node and configured to store the data signal. Further, the at least one transistor may include the first transistor and the second transistor.

According to an embodiment of the inventive concept, a first leakage current may flow through the at least one transistor in a turned-off state when the first infrared light is applied to the active region, a second leakage current may flow through the at least one transistor in the turned-off state when natural light is applied to the active region, and a difference between the first leakage current and the second leakage current may be smaller than or equal to a reference value by the first wavelength of the first infrared light.

According to an embodiment of the inventive concept, the infrared sensing module may include an infrared light emitting element configured to emit the first infrared light, an infrared sensing element configured to measure intensity of the second infrared light to output a measurement signal, and an infrared sensing controller configured to recognize the object based on a change of the measurement signal.

According to an embodiment of the inventive concept, the infrared sensing module may further include a condensing lens configured to condense and output the first infrared light.

According to an embodiment of the inventive concept, the infrared sensing module may include an infrared light emitting element configured to emit third infrared light, a first infrared transmission filter configured to pass the first infrared light included in the third infrared light, an infrared sensing element configured to measure intensity of the second infrared light to output a measurement signal, and an infrared sensing controller configured to recognize the object based on a change of the measurement signal.

According to an embodiment of the inventive concept, the infrared sensing module may further include a second infrared transmission filter configured to pass fourth infrared light included in the second infrared light, the fourth infrared light having a wavelength that is equal to a wavelength of the first infrared light. In addition, the infrared sensing element may measure intensity of the fourth infrared light.

According to an embodiment of the inventive concept, the display panel may include a first region through which the first infrared light passes, and first pixel density of the first region may be lower than second pixel density of a second region that is different from the first region.

According to an embodiment of the inventive concept, the first region may include a transmission region having transmittance that is higher than transmittance of the second region.

According to an embodiment of the inventive concept, a display device may include a display panel including an active region in which a pixel that emits light based on a data signal is disposed, and an infrared sensing module configured to transmit first infrared light that passes through the active region and to receive second infrared light that passes through the active region to recognize an object. Here, the pixel may include at least one transistor that operates in response to the data signal, and a current that flows through the at least one transistor when the at least one transistor is turned off is changed according to a change in a wavelength of light that is applied to the active region. In addition, the first infrared light may have a first wavelength by which a change rate of the current is smaller than or equal to a reference value.

According to an embodiment of the inventive concept, the infrared sensing module may include at least one selected from a proximity sensor, a gesture sensor, and a fingerprint recognition sensor.

According to an embodiment of the inventive concept, the at least one transistor may include (e.g. may be comprised of) silicon. In addition, the first wavelength of the first infrared light may have a wavelength that is out of a band of wavelengths of light that the silicon absorbs.

According to an embodiment of the inventive concept, the first wavelength of the first infrared light may be greater than 1200 nm.

According to an embodiment of the inventive concept, the first wavelength of the first infrared light may be about 1300 nm.

Therefore, a display device according to example embodiments may include a display module that displays an image on an entire region of its front surface and an infrared sensing module that is located on a back surface of the display module. Here, the infrared sensing module may transmit first infrared light that passes through the display module to go the outside of the display device (e.g., an exterior) and may recognize an object based on second infrared light that passes through the display module to go inside the display device (e.g. an interior), where one or more various types of sensors detect, for example, the presence of an object external to the display device, and/or various attributes or characteristics of the object, including but not limited to distance from the display device, gestures, biometric information (included but not limited to fingerprint, iris, facial scanning). In particular, since the first infrared light may have a first wavelength of more than 1200 nm (e.g., 1200 nm, 1300 nm, etc), luminance of a pixel located in a specific region of the display module may not be changed although the first infrared light passes through the specific region of the display module. Thus, the display device may display the image normally on the front surface of the display device while including an infrared sensing function.

In addition, in the display device, the specific region of the display module (e.g., a portion of a display panel) through which the first infrared light passes may have relatively low pixel density or may be partially transparent. Thus, transmittance of the first infrared light may be enhanced and thus recognition of the display device for the object may be increased.

According to an embodiment of the inventive concept, a display panel may include an active region in which a pixel is disposed, the pixel emits light based on a data signal; and an infrared sensing module configured to transmit a first infrared light that passes through the active region to exit the display device, and to receive a second infrared light that enters the display device and passes through the active region to recognize an object. The pixel may include at least one transistor that operates in response to receiving the data signal, and a current that flows through the at least one transistor when the at least one transistor is turned off is changed according to a change in a wavelength of light that is applied to the active region. The first infrared light may have a first wavelength having a change rate of the current that is less than or equal to a reference value.

BRIEF DESCRIPTION OF THE DRAWINGS

One or more illustrative, non-limiting embodiments will be better appreciated by a person of ordinary skill in the art from the following detailed description taken in conjunction with the accompanying drawings.

DETAILED DESCRIPTION

Hereinafter, embodiments of the present inventive concept will be explained in detail with reference to the accompanying drawings.

Figure 1A:
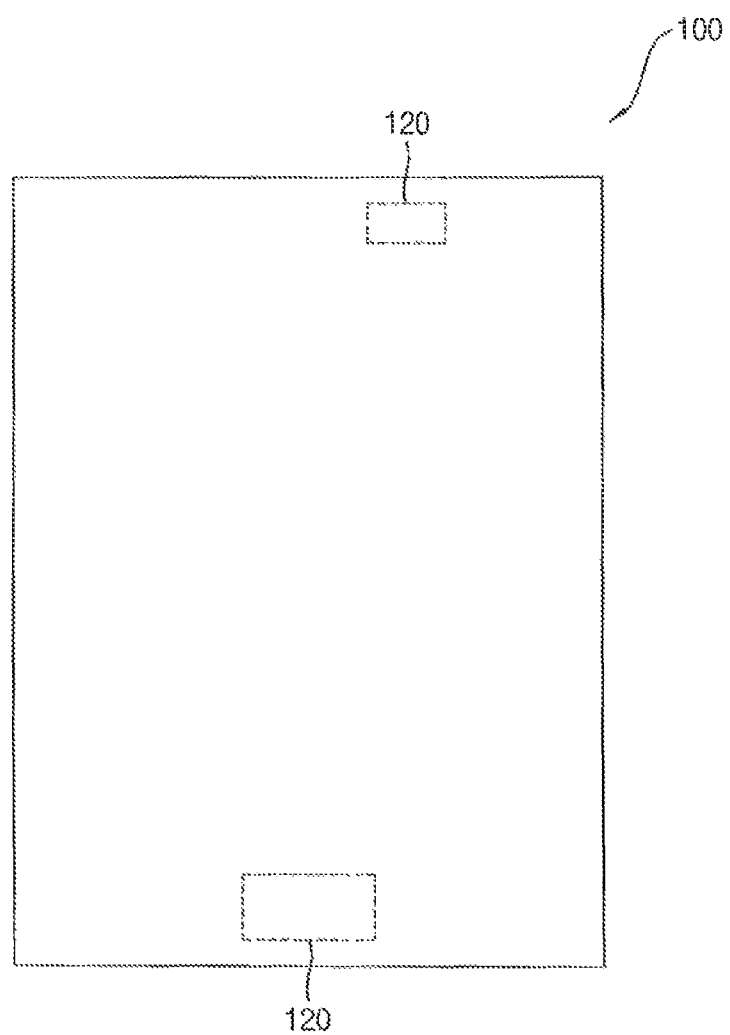
FIGS. 1A and 1B are diagrams illustrating a display device according to an embodiment of the inventive concept.
Figure 1B:
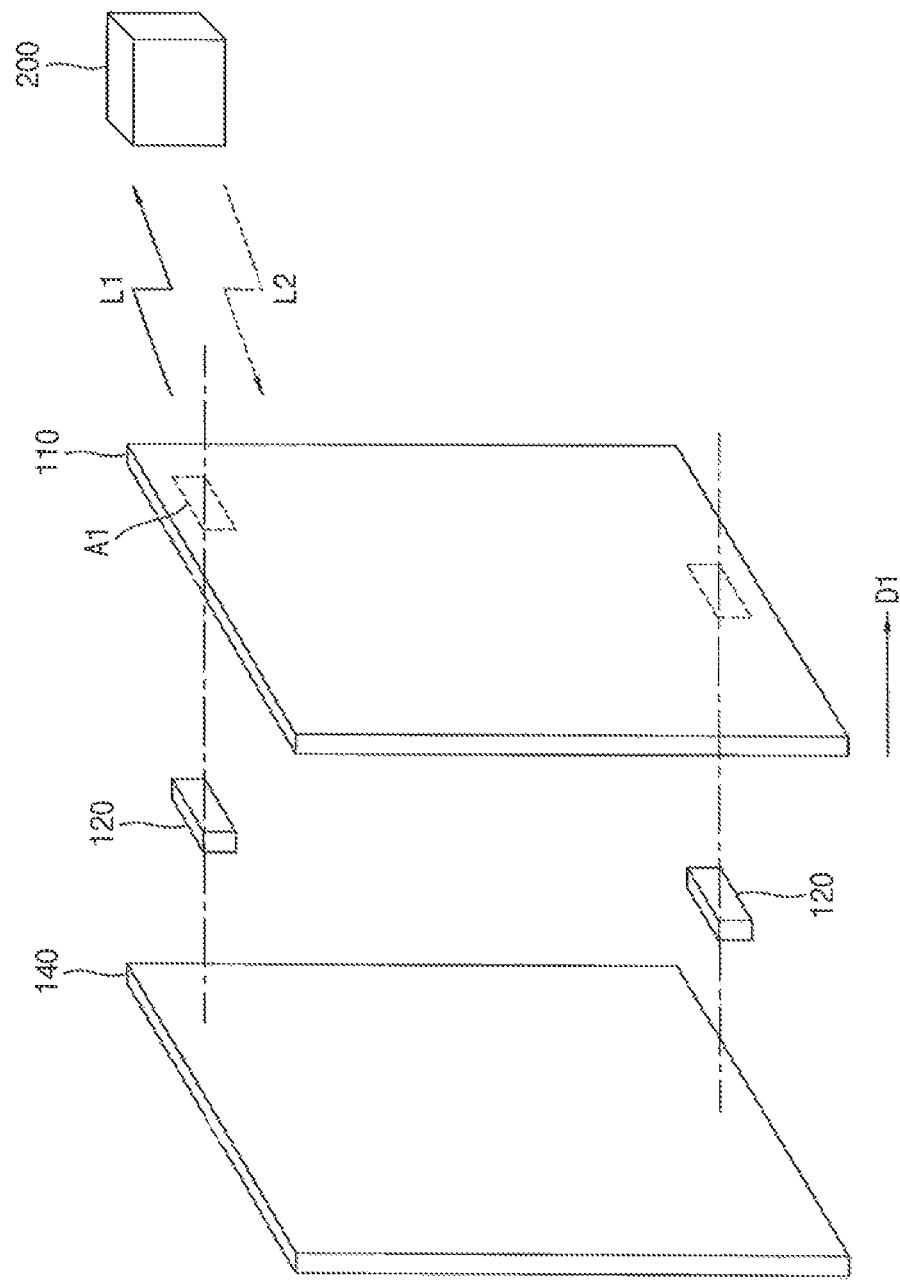
Figure 2:
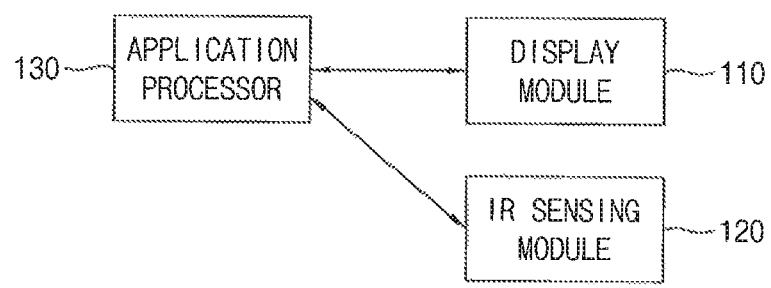
FIG. 2 is a block diagram illustrating an example of the display device of FIGS. 1A and 1B.

FIGS. 1A and 1B are diagrams illustrating a display device according to an embodiment of the inventive concept. FIG. 2 is a block diagram illustrating an example of the display device of FIGS. 1A and 1B.

Referring now to FIGS. 1A, 1B, and 2, the display device 100 may include a display module 110, an infrared sensing module 120, and an application processor 130. For example, the display device 100 may be a smart phone.

The display module 110 may display an image based on image data. Here, the display module 110 may display the image on an entire region of its front surface (e.g., a surface of the display module 110 in a first direction D1). The entire front surface (without a border or bezel) may be used for display of an image. In other words, the entire region of the front surface of the display module 110 may be an active region in which pixels are arranged, and thus the display module 110 may not include a bezel (e.g., referred to as a dead space, an inactive region, etc) on its front surface.

The infrared sensing module 120 (shown in FIG. 1B) may be located on a back surface of the display module 110 (e.g., a rear surface of the display module 110 in a direction opposite to the first direction D1). In other words, the infrared sensing module 120 may be located between the display module 110 and a case 140 (or, a cover, a housing, etc). Here, the case 140 may provide an outward form of the display device 100 and may protect internal components (e.g., a battery, a memory device, etc) against external shocks (or, external stresses).

The infrared sensing module 120 may transmit first infrared light L1, may receive second infrared light L2, and may recognize an object 200 based on a change of the second infrared light L2. Here, the first infrared light L1 may travel in the first direction D1 and may pass through a first region A1 of the display module 110. In addition, the second infrared light L2 may include reflected light that is generated by at least a portion of the first infrared light L1 being reflected off of the object 200, may travel in the direction opposite to the first direction D1, and may pass through the first region A1 of the display module 110.

The infrared sensing module 120 may be arranged such that a portion from which the infrared light is transmitted may face the rear surface of the display panel to transmit the first infrared light through a portion of the display panel that exits the front surface of the display panel. The portion of the display panel may be an active region, or another region having a lower pixel density than a remainder of the active region. For example, the other region may be a region where the display panel is substantially transparent. An artisan should understand and appreciate that the display device 100 may have more than one infrared sensing module 120. A plurality of infrared sensing modules 120 could be located on or facing the rear surface of the display panel in areas having lower pixel density or transparency than an active region. For example, infrared sensing modules 120 could be arranged, as shown in FIG. 1A near upper and lower edges of the rear surface of the display panel. The infrared sensing modules 120 may also be arranged along lateral edges of the rear surface of the display panel.

In an embodiment of the inventive concept, the infrared sensing module 120 may include one or more types of sensors, and the one or more types sensors may comprise, for example, a proximity sensor, a gesture sensor, a fingerprint recognition sensor, and/or an iris recognition sensor, etc., just to name some non-limiting possible examples of various types of sensors. Moreover, for example, the proximity sensor may detect a location of the object 200 (e.g., a distance between the object 200 and the display device 100) when the object 200 approaches the display device 100. The gesture sensor, for example, may sense infrared lights (or, intensities of the infrared lights, infrared energies) of a plurality of points (e.g., a plurality of points on the front surface of the display device 100) and may detect a motion of the object 200 (or, a moving direction, a moving distance, a moving speed, a moving pattern, a gesture, etc) based on changes of the infrared lights. The fingerprint recognition sensor may generate an image of a fingerprint of a user based on the infrared light and may recognize the fingerprint of the user by analyzing a contrast pattern of the image. The iris recognition sensor may generate a picture of an iris of a user based on the infrared light and may recognize the iris of the user by analyzing a contrast pattern of the picture.

The wavelength of the first infrared light L1 may be a wavelength greater than a predetermined value so that a luminance of light emitted by the pixel is not affected by operation of the infrared sensing module 120. The predetermined value of the wavelength may be, for example, 1200 nm. However, the inventive concept is not limited to such a value.

For example, in at least one embodiment of the inventive concept, the first infrared light L1 may have a first wavelength of more than about 1200 nm. For example, the first wavelength of the first infrared light L1 may be about 1300 nm.

Each of the pixels arranged in the display module 110 may include a transistor, and the transistor may have different characteristics according to a wavelength of incident light. For example, an amount of a leakage current that flows through the transistor (e.g., an amount of a current that flows through the transistor when the transistor is turned off) may change according to the wavelength of the incident light. These characteristics will be described in more detail with reference to FIGS. 4, 5A, 5B, and 5C. Accordingly, based on the same data signal, a pixel in the first region A1 of the display module 110, where the first and second infrared lights L1 and L2 pass through the first region A1 of the display module 110, may emit light having luminance different from that of light emitted by a pixel in another region of the display module 110 (e.g., a region other than the first region A1 in the display module 110 or a region through which only natural light passes).

When the first infrared light L1 has the first wavelength of greater than 1200 nm, an amount (or, a rate) of a change in the leakage current of the transistor included in the first region A1 may be sharply reduced. In addition, when the first infrared light L1 has the first wavelength of 1300 nm, the amount (or, a rate) of change in the leakage current of the transistor included in the first region A1 may stay the same (e.g. no change in the rate).

A structure of the infrared sensing module 120 will be described in detail with reference to FIG. 6. The first wavelength of the first infrared light L1 will be described in detail with reference to FIGS. 5A through 5C.

The application processor 130 may include a function that executes application programs an operating system (OS) of the display device 100 (e.g., a smart phone, a tablet PC, etc) and a function that controls external system devices and/or interfaces.

In an embodiment of the inventive concept, the application processor 130 may control operation of the display module 110 and the infrared sensing module 120. For example, the application processor 130 may stop an operation of the display module 110 when the infrared sensing module 120 recognizes the object 200 (or, when the object 200 approaches the display module 110). For example, the application processor 130 may stop an operation of the infrared sensing module 120 and may control the display module 110 to operate regardless of whether the object 200 is recognized.

In brief, the display device 100 may include the display module 110 that displays the image on the entire region of its front surface and the infrared sensing module 120 that is located on the rear (e.g. back) surface of a display panel of the display module 110. The infrared sensing module 120 may transmit the first infrared light L1 that passes through the display module 110 and may recognize the object 200 based on the second infrared light L2 that passes through the display module 110. Here, since the first infrared light L1 has the first wavelength of more than 1200 nm, the pixels in the first region A1 of the display module 110 may operate normally although the first infrared light L1 passes through the first region A1 of the display module 110. Thus, the display device 100 may display the image normally on its front surface (e.g. a front surface of a display panel) while including an infrared sensing function.

Figure 3:
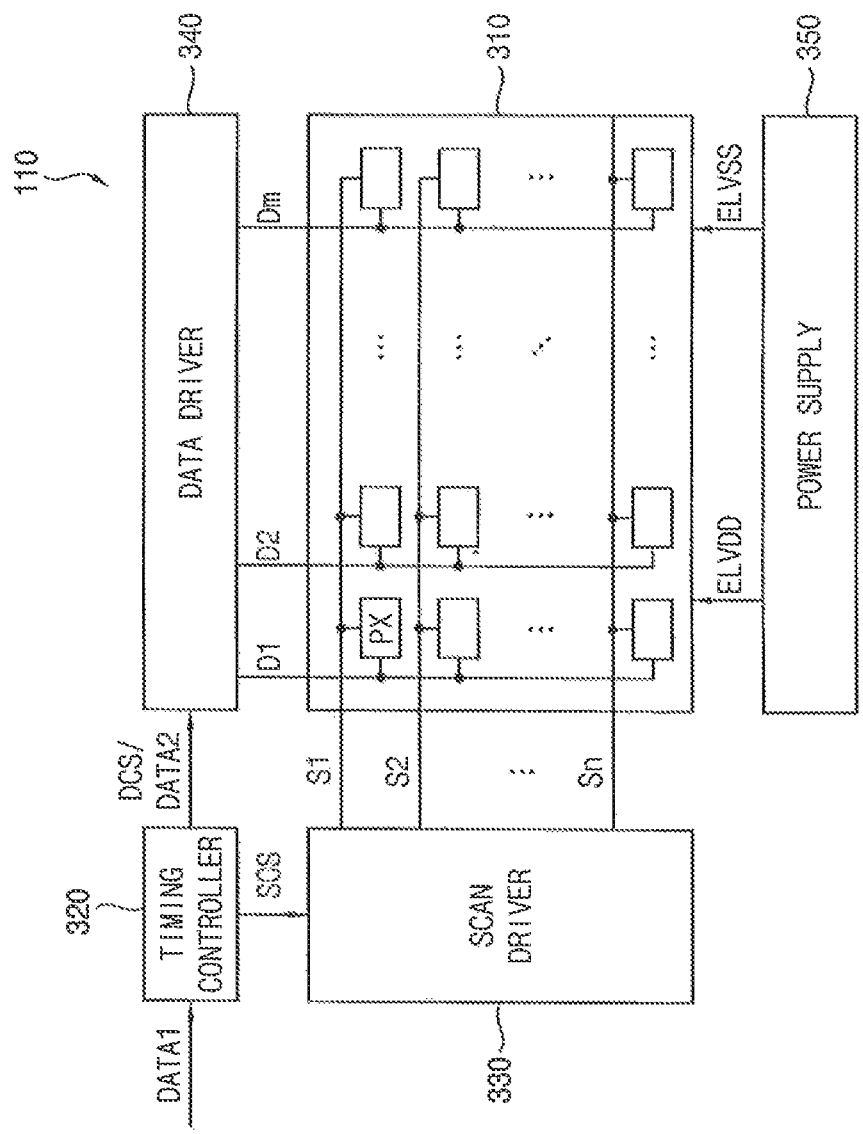
FIG. 3 is a block diagram illustrating an example of a display module included in the display device of FIG. 2.
Figure 4:
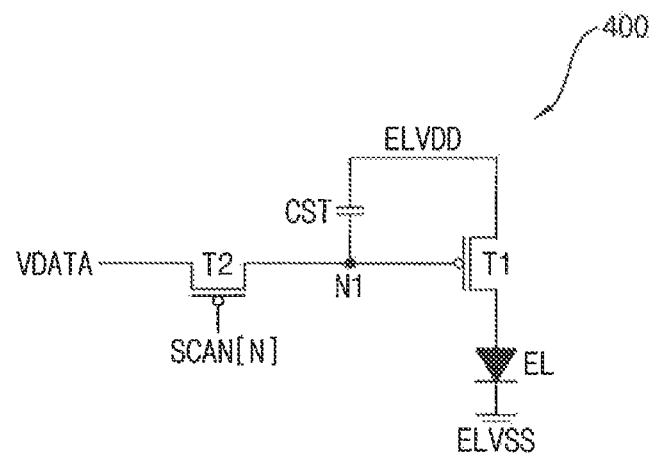
FIG. 4 is a circuit diagram illustrating an example of a pixel included in the display module of FIG. 3.

FIG. 3 is a block diagram illustrating an example of a display module included in the display device of FIG. 2. FIG. 4 is a circuit diagram illustrating an example of a pixel included in the display module of FIG. 3. A structure of the display module 110 will now be described in detail with reference to FIG. 3.

Referring to FIG. 3, the display module 110 may include a display panel 310, a timing controller 320, a scan driver 330, and a data driver 340.

The timing controller 320 may, for example, control the scan driver 330 and the data driver 340 by receiving input data (e.g., first data DATA1) and input control signals (e.g., a horizontal synchronization signal, a vertical synchronization signal, and clock signals) from an external device, by generating image data (e.g., second data DATA2) suitable for image displaying by a display panel of the display module 110, and by generating a scan driving control signal SCS and a data driving control signal DCS based on the input control signals.

The scan driver 330 may generate a scan signal based on the scan driving control signal SCS received from the timing controller 320. The scan driving control signal SCS may include a start pulse and clock signals. The scan driver 330 may include shift registers that sequentially generate the scan signal based on the start pulse and the clock signals.

The data driver 340 may generate a data signal based on the data driving control signal DCS. The data driver 340 may convert the image data from a digital data signal into an analog data signal. The data driver 340 may generate the data signal corresponding to the image data (e.g., data values included in the image data) based on predetermined gray-scale voltages (or, predetermined gamma voltages) and may sequentially provide the data signal to the display panel of the display module 110.

With continued reference to FIG. 3, the display panel of display module 110 may include scan-lines S1 through Sn, data-lines D1 through Dm, and pixels PX, where n and m are integers greater than or equal to 2. The pixels PX may be arranged at locations corresponding to intersecting points of the scan-lines S1 through Sn and the data-lines D1 through Dm. Each of the pixels PX may store the data signal that is provided through the data-lines D1 through Dm in response to the scan signal that is provided through the scan-lines S1 through Sn and may emit light based on the stored data signal.

The display panel 310 may be disposed on the front surface of the display module 110 (or, the display device 100), and thus only a front surface of the display panel 310 may be exposed to the outside. In addition, the timing controller 320, the scan driver 330, and the data driver 340 may be located on a back (e.g. rear) surface of the display panel 310.

Referring now to FIG. 4, the pixel 400 may include a light emitting element EL, a first transistor T1, a second transistor T2, and a storage capacitor Cst.

The light emitting element EL may be connected, for example, between a first power voltage ELVDD and a second power voltage ELVSS. Here, the first power voltage ELVDD may be greater than the second power voltage ELVSS. The light emitting element EL may emit light based on an amount of a driving current that flows through the light emitting element EL between the first power voltage ELVDD and the second power voltage ELVSS. In addition, the light emitting element EL, may be an organic light emitting diode. However, a person of ordinary skill in the art should understand and appreciate that the inventive concept is not limited to a particular type of light emitting element. Here, the first and second power voltages ELVDD and ELVSS may be generated by a power supply 350 illustrated in FIG. 3.

The first transistor T1 may include a first electrode that is connected to the first power voltage ELVDD, a second electrode that is connected to the light emitting element EL (e.g., an anode of the light emitting element EL), and a gate electrode that is connected to a first node N1. The first transistor T1 may control the driving current (e.g., an amount of the driving current) in response to a first node voltage of the first node N1 to open and close the gate of the first transistor T1.

The second transistor T2 may include a first electrode that receives the data signal Vdata, a second electrode that is connected to the first node N1, and a gate electrode that receives the scan signal scan[n]. The second transistor T2 may transfer the data signal Vdata to the first node N1 in response to a voltage level of the scan signal scan[n].

The storage capacitor Cst may be connected between the first node N1 and the first power voltage ELVDD. The storage capacitor Cst may store the data signal Vdata transferred via the second transistor T2.

Although it is illustrated in FIG. 4 that the pixel 400 includes the first and second transistors T1 and T2 and the storage capacitor Cst, the inventive concept is not limited to pixels having the structure as pixel 400. For example, the pixel 400 may have a 7T-1C structure including seven transistors and one capacitor. Although it is illustrated in FIG. 4 that the first and second transistors T1 and T2 of the pixel 400 are implemented by P-type transistors, the first and second transistors T1 and T2 of the pixel 400 may be implemented by N-type transistors. The aforementioned are just a few of the possible arrangements according to the inventive concept.

As described above, the pixel 400 may exhibit different characteristics according to a particular wavelength of light that enters (or, passes through) the pixel 400 (e.g., incident light). For example, even when the pixel 400 receives the same data signal, the pixel 400 may emit light having different luminance according to the wavelength of the incident light. For example, luminance implemented by a pixel to which infrared light having a wavelength of 940 nm (e.g., infrared light transmitted by a conventional infrared sensor) is applied may be different from luminance implemented by the pixel to which natural light is applied.

In the embodiment shown in FIG. 4, a person of ordinary skill in the art should appreciate that the pixel 400 includes the light emitting element EL, the first and second transistors T1 and T2, and the storage capacitor Cst, a change in characteristics of the pixel 400 may be caused by the light emitting element EL, the first and second transistors T1 and T2, and the storage capacitor Cst. Hereinafter, the change in characteristics of the pixel 400 will be described in detail with reference to experimental examples.

First Experimental Example

In a first case where infrared light was not applied to the pixel 400 (or, when only the natural light is applied to the pixel 400), first luminance (e.g., reference luminance) implemented by the light emitting element EL of the pixel 400 was measured. As the infrared light having the wavelength of 940 nm was applied to just the light emitting element EL of the pixel 400, a second luminance implemented by the light emitting element EL of the pixel 400 was measured. In this case, the first luminance was equal to the second luminance.

The second luminance implemented by the light emitting element EL of the pixel 400 was measured by changing the wavelength of the infrared light that is applied to the light emitting element EL of the pixel 400 among various wavelengths, which were, for example 625 nm, 880 nm, 970 nm, 1050 nm, 1200 nm, 1300 nm, and 1450 nm. In this case, the first luminance was equal to the second luminance.

In conclusion, from the first experimental example, it was confirmed that the light emitting element EL of the pixel 400 was not affected by the infrared light (e.g., the wavelength of the infrared light).

Second Experimental Example

The infrared light was applied to just the storage capacitor Cst of the pixel 400. Here, the second luminance implemented by the light emitting element EL of the pixel 400 was measured by changing the wavelength of the infrared light that is applied to the storage capacitor Cst of the pixel 400. In this case, the first luminance was equal to the second luminance.

In conclusion, from the [second experimental example], it was confirmed that the storage capacitor Cst of the pixel 400 was not affected by the infrared light (e.g., the wavelength of the infrared light).

Third Experimental Example

As the infrared light was not applied to the pixel 400, a first leakage current of the first transistor T1 of the pixel 400 (e.g., a leakage current flowing through the first transistor T1 when the first transistor T1 is turned off) was measured. As the infrared light having the wavelength of 940 nm was applied to only the first transistor T1 of the pixel 400, a second leakage current of the first transistor T1 of the pixel 400 was measured, and a graph is provided to illustrate the response.

Figure 5A:
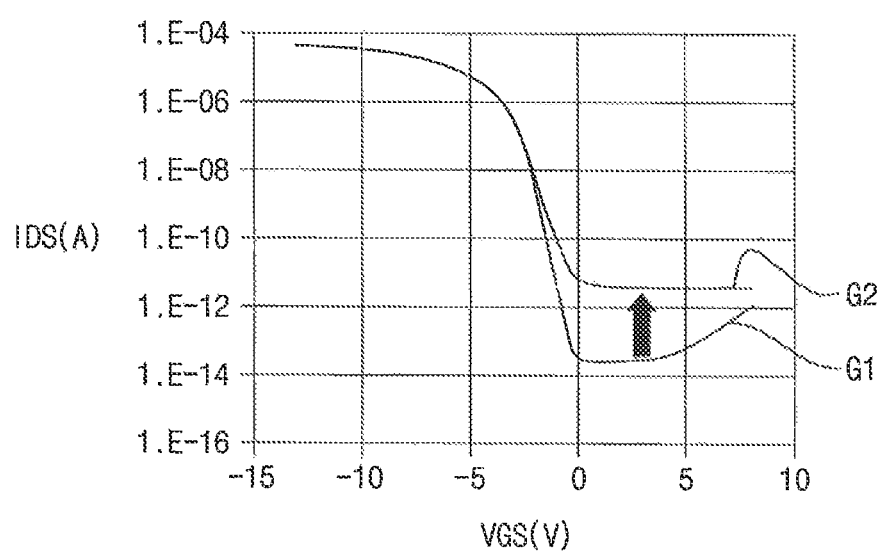
FIG. 5A is a diagram illustrating a leakage current of transistors included in the pixel of FIG. 4.

FIG. 5A is a diagram illustrating a leakage current of transistors included in the pixel of FIG. 4.

Referring to FIG. 5A, a gate voltage VGS refers to a voltage applied to a gate electrode of the first transistor T1 (or a voltage between the gate electrode and a source electrode in the first transistor T1), and a current IDS refers to a current flowing through the first transistor T1.

The first curve G1 indicates the first current flowing through the first transistor T1 when the infrared light was not applied to the pixel 400. The second curve G2 indicates the second current flowing through the first transistor T1 when the infrared light having the wavelength of 940 nm was applied to only the first transistor T1.

As illustrated in FIG. 5A, the second current was equal to the first current when the gate voltage VGS was less than −5 volt (V), more accurately, less than −3 volt (e.g., when the P-type transistor was turned on).

On the other hand, the second current was different from the first current when the gate voltage VGS was more than −0 volt, more accurately, more than −3 volt (e.g., when the P-type transistor is turned off). As illustrated in FIG. 5A, when the gate voltage VGS was 0 volt, the second current was about 1.E-14 (e.g., $10^{-14}$) ampere (A) and the first current was about 1.E-11 (e.g., $10^{-11}$) ampere. In other words, the leakage current of the first transistor T1 was increased.

In conclusion, from the third experimental example and FIG. 5A, it was confirmed that the first transistor T1 of the pixel 400 was affected by the infrared light (e.g., the wavelength of the infrared light).

Similarly, the second transistor T2 was experimented under the same condition as that of the third experimental example. As a result, the leakage current of the second transistor T2 was similar to the leakage current of the first transistor T1. In conclusion, from the third experimental example and FIG. 5A, it was confirmed that the second transistor T2 of the pixel 400 was affected by the wavelength of infrared light.

For reference, the first and second transistors T1 and T2 may include silicon (Si), and the silicon may absorb light having a specific wavelength band. Thus, it was assumed that characteristics of the silicon changed characteristics of the first and second transistors T1 and T2. Based on this assumption, the third experimental example was repeatedly performed by changing the wavelength of the infrared light.

Figure 5B:
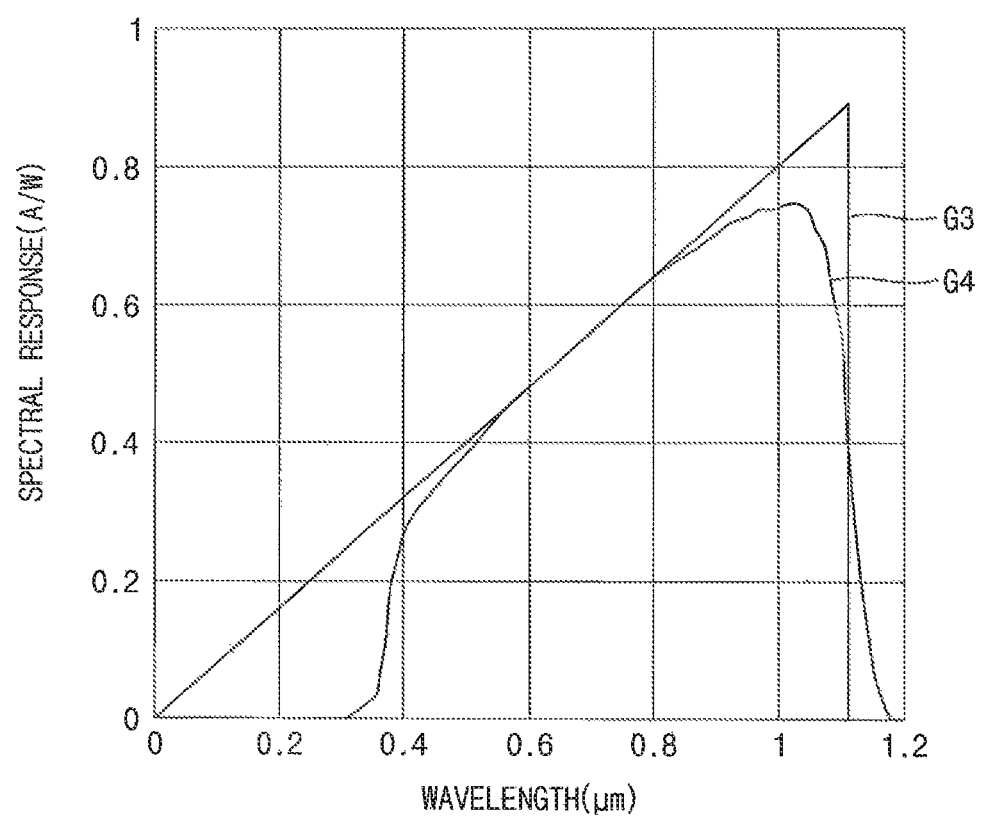
FIG. 5B is a diagram illustrating characteristics of silicon transistors included in the pixel of FIG. 4.

FIG. 5B is a diagram illustrating characteristics of silicon of transistors included in the pixel of FIG. 4.

Referring to FIG. 5B, a third curve G3 indicates an ideal spectral response of the silicon, and a fourth curve G4 indicates an actual spectral response of the silicon.

The silicon absorbed light having a first wavelength band between 0 micrometer (μm) (or, in some embodiments of the inventive concept, 0.01 μm or 10 nanometer (nm)) and 1.1 μm along the third curve G3. As a wavelength was longer in the first wavelength band, an amount of light absorbed by the silicon was increased.

The silicon absorbed light having a second wavelength band between 0.4 μm (or, 400 nm) and 1.2 μm (or, 1200 nm) along the fourth curve G4. Here, the silicon absorbed most of light having a wavelength of 1 μm, and thus an absorption amount of light having a wavelength of more than 1 μm was sharply decreased. The energy gap (or, band gap) of the silicon was 1.12 electron volt (eV) corresponding to light having a wavelength of about 1.1 μm (or, 1100 nm).

Fourth Experimental Example

When the wavelength of the first infrared light L1 was out of the second wavelength band (e.g., a wavelength band between 0.4 µm and 1.1 µm), assuming that the leakage current of the first transistor T1 (or, the second transistor T2) was not changed, the fourth experimental example was repeatedly performed by changing the wavelength of the infrared light.

More specifically, as the infrared light was not applied to the pixel 400, the first leakage current of the first transistor T1 (e.g., the leakage current flowing through the first transistor T1 when the first transistor T1 was turned off) was measured. In addition, as the infrared light was applied to only the first transistor T1, the second leakage current of the first transistor T1 was measured. Here, the second leakage current was repeatedly measured by changing the wavelength of the infrared light among 625 nm, 880 nm, 970 nm, 1050 nm, 1200 nm, 1300 nm, and 1450 nm.

Figure 5C:
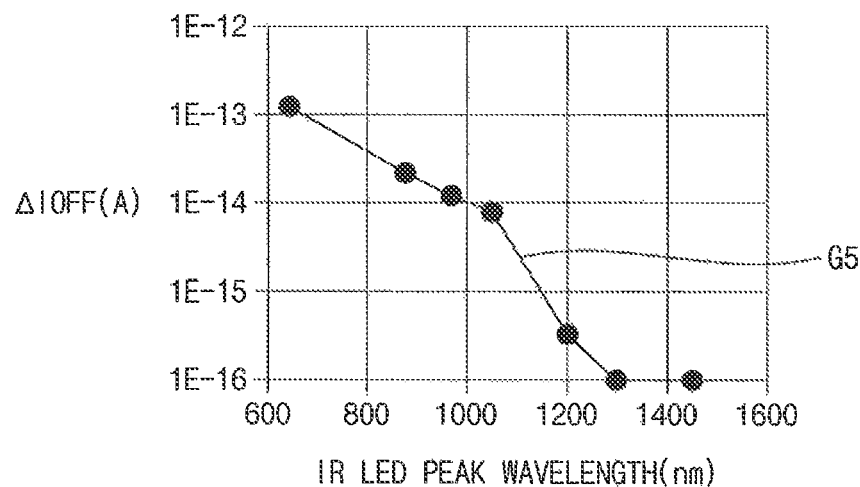
FIG. 5C is a diagram illustrating an example in which the leakage current of FIG. 5A is changed according to a wavelength of infrared light.

FIG. 5C is a diagram illustrating an example in which the leakage current of FIG. 5A is changed according to a wavelength of infrared light.

Referring to FIG. 5C, a fifth curve G5 indicates a current difference Δ IOFF between a first leakage current and a second leakage current according to a wavelength.

Along the fifth curve G5, the current difference Δ IOFF was 1.E-13 ampere when the wavelength of the infrared light was 625 nm, the current difference Δ IOFF was reduced when the wavelength of the infrared light was 1050 nm, the current difference Δ IOFF was sharply reduced when the wavelength of the infrared light was 1200 nm (e.g., the current difference Δ IOFF when the wavelength of the infrared light was 1200 nm was less than 1/20 of the current difference Δ IOFF when the wavelength of the infrared light was 1050 nm), and the current difference Δ IOFF was less than 1.E-16 (or, zero) ampere when the wavelength of the infrared light was more than 1300 nm (e.g., 1300 nm, 1450 nm, etc). For example, the current difference Δ IOFF when the wavelength of the infrared light was 625 nm had the greatest value, and the current difference Δ IOFF when the wavelength of the infrared light was more than 1300 nm had the smallest value.

In brief, the current difference Δ IOFF shown in FIG. 5C when the wavelength of the infrared light was 1200 nm was significantly reduced as compared to the current difference Δ IOFF when the wavelength of the infrared light was less than 1200 nm. In addition, the leakage current of the first transistor T1 was not changed when the wavelength of the infrared light was more than 1300 nm.

Generally, as an energy (or, a wavelength energy) of the infrared light is weaker as a wavelength of the infrared light is longer. Thus, as the wavelength of the infrared light is longer, the sensing performance of the infrared sensing module 120 that uses the infrared light may be degraded. In other words, the energy of the infrared light is inversely proportional to the wavelength of the infrared light. Thus, the first infrared light L1 may have a wavelength included in a wavelength band between 1200 nm and 1400 nm corresponding to a range of energy reduction of less than 30%.

In an embodiment of the inventive concept, the first infrared light L1 may have a wavelength of 1200 nm. In this case, the energy of the first infrared light L1 may be maximized while minimizing an amount (or, a rate) of a change in the leakage current of the first and second transistors T1 and T2 included in the pixel 400 (or, while controlling a change in luminance implemented by the pixel 400 not to be perceived by a user).

In an embodiment of the inventive concept, the first infrared light L1 may have a wavelength of 1300 nm. In this case, the energy of the first infrared light L1 may be maximized while preventing the change in the leakage current of the first and second transistors T1 and T2 included in the pixel 400.

As described with reference to FIGS. 4, 5A, 5B, and 5C, although the leakage current of the first and second transistors T1 and T2 is changed according to the wavelength of the first infrared light L1 that is transmitted by the infrared sensing module 120 and then input to the pixel 400, the leakage current of the first and second transistors T1 and T2 may not change when the first infrared light L1 has a wavelength of more than 1200 nm. In other words, the pixel 400 may emit light normally when the first infrared light L1 has a wavelength of more than 1200 nm. In addition, when the first infrared light L1 has a wavelength of 1200 nm, the sensing performance of the infrared sensing module 120 may be maximized while controlling the change in luminance implemented by the pixel 400 not to be perceived by the user. Further, when the first infrared light L1 has a wavelength of 1300 nm, the first infrared light L1 may not affect the pixel 400.

Figure 6:
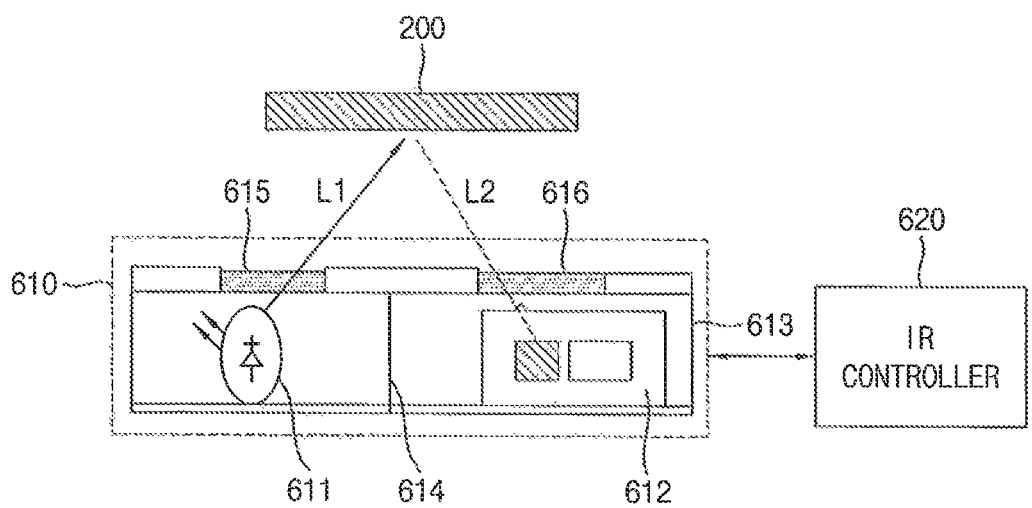
FIG. 6 is a block diagram illustrating an example of an infrared sensing module included in the display device of FIG. 2.

FIG. 6 is a block diagram illustrating an example of an infrared sensing module included in the display device of FIG. 2.

Referring to FIGS. 2 and 6, the infrared sensing module 120 may include, for example, an infrared sensor 610 and an infrared sensing controller 620.

The infrared sensor 610 may include an infrared light emitting element 611 and an infrared sensing element 612.

The infrared light emitting element 611 may output (or, transmit) the first infrared light L1. For example, the infrared light emitting element 611 may be an infrared light emitting diode, and the first infrared light L1 having a wavelength of more than 1200 nm may be output. The infrared light emitting element 611 may be located within a sensor case 613. The infrared light emitting element 611 may output the first infrared light L1 in a specific direction (e.g., in the first direction D1 as illustrated in FIG. 1B).

The infrared sensing element 612 may measure (or, sense) intensity of the second infrared light L2 to generate a measurement signal. Here, the second infrared light L2 may include reflected light that is generated by the first infrared light L1 being reflected by the object 200. As described above, the infrared sensing element 612 may be located within the sensor case 613. Here, the infrared sensing element 612 may be located in a space that is different from a space in which the infrared light emitting element 611 is located, where the space in which the infrared sensing element 612 is located may be separated, by an optical wall 614, from the space in which the infrared light emitting element 611 is located.

In an embodiment of the inventive concept, the infrared sensing element 61 may be an infrared image-pickup element or an infrared imaging element. The infrared sensing element 612 may include a plurality of sensing elements and may generate a two-dimensional (2D) infrared image. In this case, the infrared sensing module 120 may be a fingerprint recognition sensor or an iris recognition sensor.

In an embodiment of the inventive concept, the infrared sensor 610 may further include a condensing lens. Here, the condensing lens may be disposed over the infrared light emitting element 611 (or, on the path along which the first infrared light L1 output from the infrared light emitting element 611 travels). In this case, the energy of the first infrared light L1 may be strengthened (or, increased).

In an embodiment of the inventive concept, the infrared sensor 610 may further include a first infrared transmission (or, a penetration) filter 615. Here, the first infrared transmission filter 615 may be disposed over the infrared light emitting element 611 (or, on the path along which the first infrared light L1 output from the infrared light emitting element 611 travels). Thus, the first infrared transmission filter 615 may allow only the first infrared light L1 having a wavelength of more than 1200 nm (or, 1300 nm) to pass through. In this case, the infrared light emitting element 611 may emit third infrared light having a wavelength of less than 1200 nm, but the infrared sensor 610 may emit only the first infrared light having a wavelength of more than 1200 nm using the first infrared transmission filter 615.

In an embodiment of the inventive concept, the infrared sensor 610 may further include, for example, a second infrared transmission filter 616. Here, the second infrared transmission filter 616 may be disposed over the infrared sensing element 612 (or, on the path along which the second infrared light L2 input to the infrared sensing element 612 travels). Thus, the second infrared transmission filter 616 may allow only fourth infrared light L4 (e.g., the reflected light that is generated by the first infrared light L1 being reflected by the object) having a wavelength of more than 1200 nm (or, 1300 nm) to pass through. In this case, the infrared sensing element 612 may generate (or, output) the measurement signal through more simple processes. For example, the infrared sensing element 612 may exclude a process of extracting the reflected light from the second infrared light L2.

The infrared sensing controller 620 may control an operation of the infrared sensor 610 and may recognize the object 200 based on the measurement signal (or, a change of the measurement signal). For example, the infrared sensing controller 620 may control an operating state, an operating cycle, etc of the infrared sensor 610 based on a control signal that is externally provided (e.g., a control signal that is provide from the application processor 130 of FIG. 2). In addition, as described above with reference to FIG. 1, the infrared sensing controller 620 may recognize (or, detect) a location of the object 200 (e.g., a distance between the object 200 and the display device 100) based on the measurement signal or may recognize a motion (or, movement) of the object 200 based on the change of the measurement signal. In addition, when the infrared sensing element 612 is the infrared image-pickup element, the infrared sensing element 612 may recognize a specific pattern (e.g., a fingerprint pattern, an iris pattern, etc) from an infrared image.

Figure 7A:
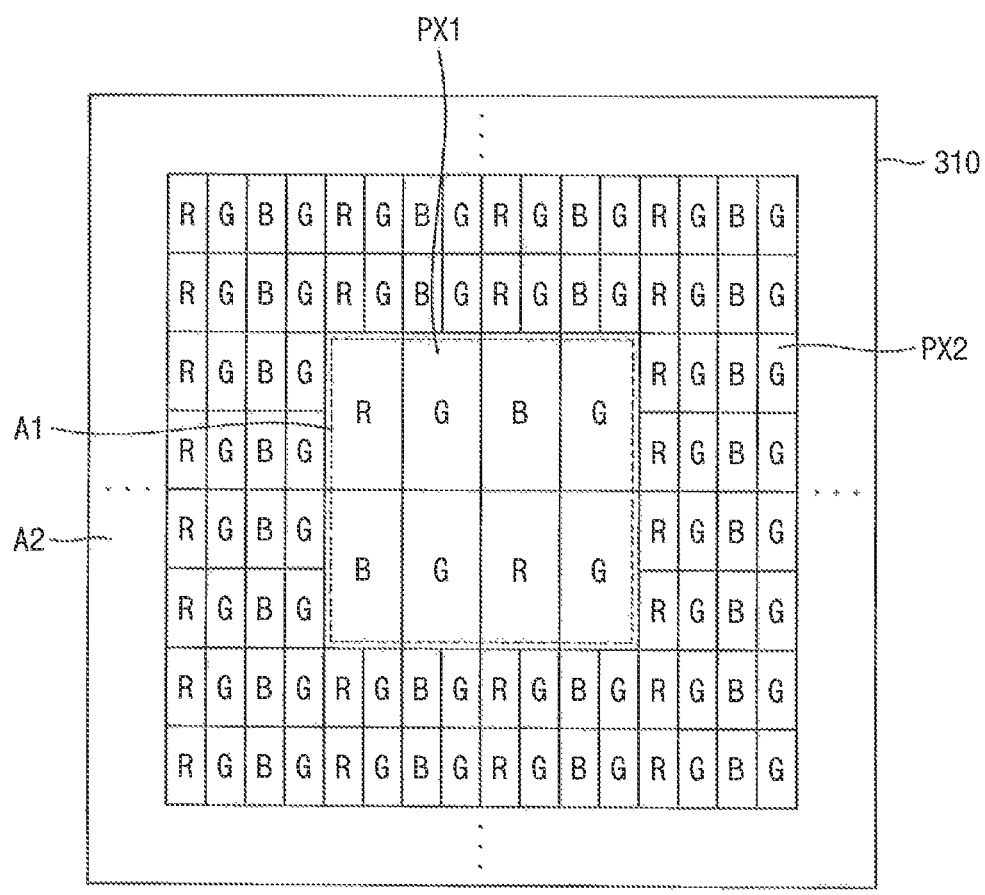
FIGS. 7A and 7B are diagrams illustrating an example of a display panel included in the display module of FIG. 3.
Figure 7B:
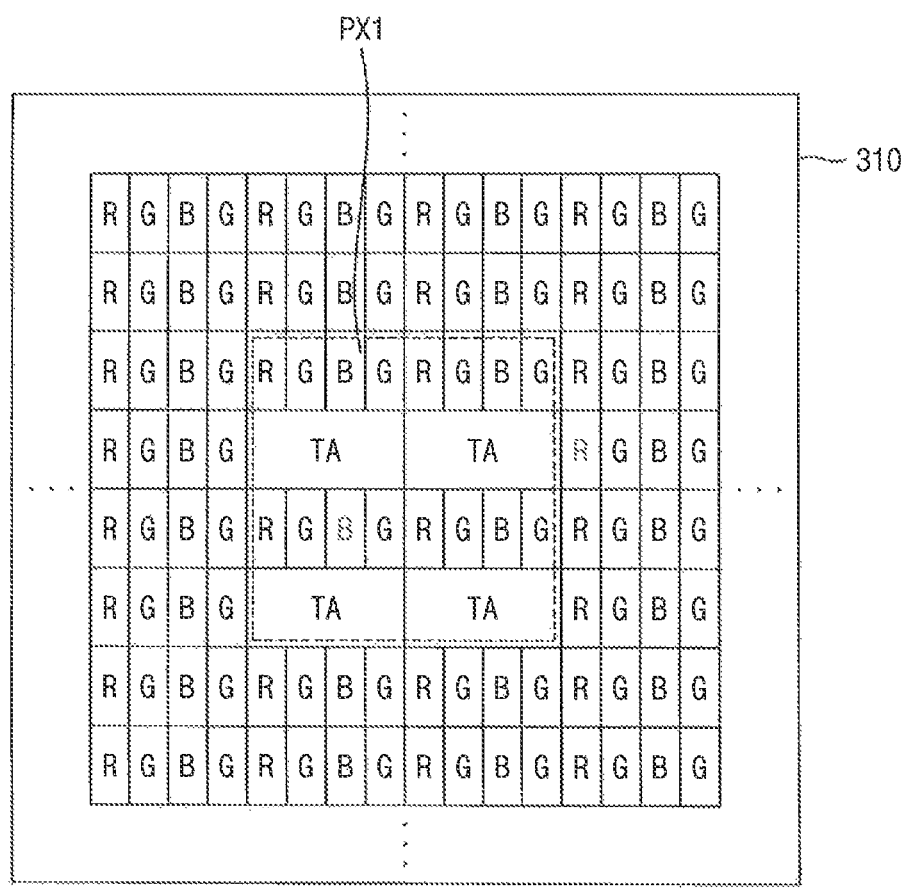

FIGS. 7A and 7B are diagrams illustrating an example of a display panel 310 included in the display module 110 of FIG. 3.

Referring to FIGS. 3 and 7A, first pixel density of the first region A1 may be lower than second pixel density of the second region A2. As described above with reference to FIG. 1B, the first infrared light L1 may be applied to the first region A1. In the display module 110 (or, an active region of the display panel 310 illustrated in FIG. 3), the second region A2 may be a region other than the first region A1.

For example, a size of a first pixel PX1 included in the first region A1 may be bigger than a size of a second pixel PX2 included in the second region A2. For example, the size of the first pixel PX1 may be four times bigger than the size of the second pixel PX2. For example, the first pixel PX1 and the second pixel PX2 include an identical pixel circuit (e.g., the transistors T1 and T2, the light emitting element EL, etc included in the pixel 400 illustrated in FIG. 4). But, the first pixel PX1 may further include an empty space in which components like wirings, transistors, etc are not formed. Thus, the light passing through the empty space of the first pixel PX1 may not be reflected or blocked by the components.

Referring to FIG. 7B, the first region A1 may include a transmission region TA (or, a transmission window). Here, the transmission region TA of the first region A1 may have transmittance higher than transmittance of the second region A2 (or, a region in which sub pixels R, G, and B that emit first color light, second color light, and third color light, respectively are formed).

For example, the transmission region TA may be located near the sub pixels R, G, and B, and the pixel circuit (e.g., electrodes, wirings, transistors, etc) may not be formed in the transmission region TA. For example, an area of the transmission region TA may be about 20%-90% of an area of the first region A1. For example, the first region A1 may be partially transparent. Thus, most of the first infrared light L1 input to the transmission region TA may pass through the transmission region TA.

As described above with reference to FIG. 5C, as the wavelength of the first infrared light L1 is longer, the energy of the first infrared light L1 may be weaker. Thus, the first infrared light L1 may be lost (or, disappeared) as the first infrared light L1 passes through the display panel 310. Thus, the display panel 310 (or, the first region A1) may be partially transparent and thus sensing performance (or, sensing accuracy, recognition rate) of the infrared sensing module 120 may be enhanced.

As described above with reference to FIGS. 7A and 7B, the first pixel density of the first region A1 through which the first infrared light L1 passes (e.g., the first region A1 of the display panel 310) may be lower than a pixel density of another region. For example, the first region A may be partially transparent. Thus, transmittance of the first infrared light L1 may be enhanced (or, increased), and thus the recognition rate of the infrared sensing module 120 may be prevented from being degraded (or, decreased).

The present inventive concept may be applied to a display device and various display systems including the display device. For example, the present inventive concept may be applied to a television, a computer monitor; a laptop, a digital camera, a cellular phone, a smart phone, a video phone, a smart pad, a smart watch, a tablet PC, a car navigation system, a personal digital assistants (PDA), a portable multimedia player (PMP), an MP3 player, etc.

The foregoing is illustrative of one or more embodiments of the inventive concept and is not to be construed as limiting thereof. Although a few embodiments of the inventive concept have been described herein, those skilled in the art will readily appreciate that many modifications are possible in the discussed embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments of the inventive concept and is not to be construed as limited to the specific embodiment discussed herein, and that modifications to the embodiments discussed herein, as well as in other embodiments, are intended to be included within the scope of the appended claims.

What is claimed is:

1. A display device comprising:
a display panel having a front surface and a rear surface, the display panel including an active region in which a pixel that emits light based on a data signal is disposed; and
an infrared sensing module disposed outside of the display panel that faces the rear surface of the display panel and that is configured to emit infrared light including at least a first infrared light that passes in a first direction away from the front surface of the display panel and through the active region, and
the infrared sensing module is configured to receive a second infrared light that passes in a second direction toward the front surface of the display panel and through the active region by which the infrared sensing module recognizes an object external to the display device,
wherein the infrared sensing module emits the first infrared light through a portion of the active region of the display panel having a lower pixel density than a remainder of the active region.

2. The display device of claim 1,
wherein the infrared sensing module is arranged on the rear surface of the display panel, and
wherein the infrared sensing module transmits the first infrared light in a first direction that is substantially perpendicular to the front surface of the display panel.

3. The display device of claim 1, further comprising a housing having a surface that faces the rear surface of the display panel, and
wherein the infrared sensing module is arranged between the rear surface of the display panel and the housing.

4. The display device of claim 1,
wherein the second infrared light includes reflected infrared light that is generated by the first infrared light being reflected by the object, and
wherein the infrared sensing module recognizes the object based on a change of the second infrared light.

5. The display device of claim 1, wherein the infrared sensing module includes at least one of a proximity sensor, a gesture sensor, and a fingerprint recognition sensor.

6. The display device of claim 1, wherein the first infrared light has a first wavelength greater than 1200 nm.

7. The display device of claim 6, wherein a luminance of the pixel located in the active region is unchanged when the infrared sensing module transmits the first infrared light at the first wavelength of greater than 1200 nm through the active region.

8. The display device of claim 1, wherein the infrared sensing module includes:
an infrared light emitting element configured to emit the first infrared light;
an infrared sensing element configured to measure intensity of the second infrared light to output a measurement signal;
a case that contains the infrared light emitting element and the infrared sensing element; and
an infrared sensing controller circuit configured to recognize the object based on a change of the measurement signal.

9. The display device of claim 8, wherein the infrared sensing module further includes a condensing lens configured to condense and output the first infrared light.

10. The display device of claim 1, wherein the infrared sensing module includes:
an infrared light emitting element configured to emit a third infrared light;
a first infrared transmission filter configured to pass the first infrared light included with the third infrared light;
an infrared sensing element configured to measure intensity of the second infrared light to output a measurement signal; and
an infrared sensing controller circuit configured to recognize the object based on a change of the measurement signal.

11. The display device of claim 10,
wherein the infrared sensing module further includes: a second infrared transmission filter configured to pass a fourth infrared light included with the second infrared light, the fourth infrared light having a wavelength that is equal to a wavelength of the first infrared light, and
wherein the infrared sensing element measures an intensity of the fourth infrared light.

12. The display device of claim 1,
wherein the active region of the display panel includes a first region through which the first infrared light passes, and
wherein a first pixel density of the first region is lower than a second pixel density of a second region that is different from the first region.

13. The display device of claim 12, wherein the first region includes a transmission region having a first transmittance that is higher than a second transmittance of the second region.

14. A display device comprising:
a display panel having a front surface and a rear surface, the display panel including an active region in which a pixel that emits light based on a data signal is disposed; and
an infrared sensing module that faces the rear surface of the display panel and that is configured to emit infrared light including at least a first infrared light that passes in a first direction away from the front surface of the display panel and through the active region, and
the infrared sensing module is configured to receive a second infrared light that passes in a second direction toward the front surface of the display panel and through the active region by which the infrared sensing module recognizes an object external to the display device,
wherein the pixel includes at least one transistor comprising silicon, and
wherein the first infrared light has a first wavelength that is outside of a wavelength band of light that is absorbed by the silicon.

15. The display device of claim 14, further comprising:
a scan driver configured to generate a scan signal; and
a data driver configured to generate the data signal based on image data that is provided from an external device,
wherein the pixel includes:
a light emitting element connected between a first power voltage and a second power voltage;
a first transistor configured to control a driving current that flows through the light emitting element in response to a first node voltage of a first node;
a second transistor configured to transfer the data signal to the first node in response to the scan signal; and
a storage capacitor connected to the first node and configured to store the data signal, and
wherein the at least one transistor includes the first transistor and the second transistor.

16. The display device of claim 15,
wherein a first leakage current flows through the at least one transistor in a turned-off state when the first infrared light is applied to the active region,
wherein a second leakage current flows through the at least one transistor in the turned-off state when natural light is applied to the active region, and
wherein a difference between the first leakage current and the second leakage current is smaller than or equal to a reference value by, the first wavelength of the first infrared light.

17. A display device comprising:
a display panel including an active region in which a pixel is disposed, the pixel emits light based on a data signal; and
a single, integrated infrared sensing module that faces a rear surface of the display panel and that is configured to emit a first infrared light that passes through the active region to exit the display device, and to receive a second infrared light that enters the display device and passes through the active region to recognize an object,
wherein the pixel includes at least one transistor that operates in response to receiving the data signal, and a current that flows through the at least one transistor when the at least one transistor is turned off is changed according to a change in a wavelength of light that is applied to the active region, and
wherein the first infrared light has a first wavelength having a change rate of the current that is less than or equal to a reference value.

18. The display device of claim 17, wherein the first wavelength of the first infrared light is greater than 1200 nm.

19. A display device comprising:
a display panel including an active region in which a pixel is disposed, the pixel emits light based on a data signal; and
an infrared sensing module that faces a rear surface of the display panel and that is configured to emit a first infrared light that passes through the active region to exit the display device, and to receive a second infrared light that enters the display device and passes through the active region to recognize an object,
wherein the pixel includes at least one transistor that operates in response to receiving the data signal, and a current that flows through the at least one transistor when the at least one transistor is turned off is changed according to a change in a wavelength of light that is applied to the active region,
wherein the first infrared light has a first wavelength having a change rate of the current that is less than or equal to a reference value,
wherein the at least one transistor is comprised of silicon, and
wherein the first wavelength of the first infrared light is outside of a band of wavelengths of light that is absorbed by the silicon.

* * * * *